United States Patent [19]
Chough

[11] 3,767,491
[45] Oct. 23, 1973

[54] PROCESS FOR ETCHING METALS EMPLOYING ULTRASONIC VIBRATION

[75] Inventor: Euiwon Chough, Beacon, N.Y.
[73] Assignee: Cogar Corporation, Wappingers Falls, N.Y.

[22] Filed: Oct. 27, 1970
[21] Appl. No.: 84,322

[52] U.S. Cl. ........................... 156/5, 156/8, 156/17, 156/21, 156/23, 252/79.4, 252/136
[51] Int. Cl. ............................................ B29c 17/08
[58] Field of Search .................... 252/101, 136, 143, 252/79.4; 156/21, 22, 5, 8, 17; 134/1

[56] References Cited

UNITED STATES PATENTS

| | | | |
|---|---|---|---|
| 2,446,060 | 7/1948 | Pray et al. | 252/101 |
| 3,202,612 | 8/1965 | Nelson | 252/79.4 |
| 1,011,203 | 12/1911 | Jahn | 252/143 |
| 3,448,055 | 6/1969 | Miekelson et al. | 252/79.3 |
| 3,033,710 | 5/1962 | Hightower et al. | 134/1 |
| 3,412,456 | 11/1968 | Ebisawa | 156/17 |
| 3,290,756 | 12/1966 | Chang | 156/17 |
| 2,981,610 | 4/1961 | Snyder et al. | 134/1 |
| 2,593,449 | 4/1952 | Hesch | 156/21 |
| 2,585,127 | 2/1952 | Holman et al. | 252/136 |
| 3,700,508 | 10/1972 | Keen | 156/17 |

FOREIGN PATENTS OR APPLICATIONS

| | | | |
|---|---|---|---|
| 500,009 | 2/1939 | Great Britain | 252/143 |

*Primary Examiner*—George F. Lesmes
*Assistant Examiner*—M. E. McCamish
*Attorney*—Harry M. Weiss

[57] ABSTRACT

This disclosure is directed to a metal etching solution and process for etching very fine metal lines or a metal conductive pattern used, for example, in the semiconductor industry where an integrated circuit conductive metal pattern is formed on an insulating semiconductor substrate surface to provide interconnection between the devices in the semiconductor substrate as per a desired circuit configuration. The process uses ultrasonic etching with the addition of either a mono or polyhydric alcohol to the metal etching acid solution. Some examples of the alcohol additives used in the solution are isopropanol, n-propanol, cyclohexanol, benzyl alcohol, glycol, and glycerine.

3 Claims, 1 Drawing Figure

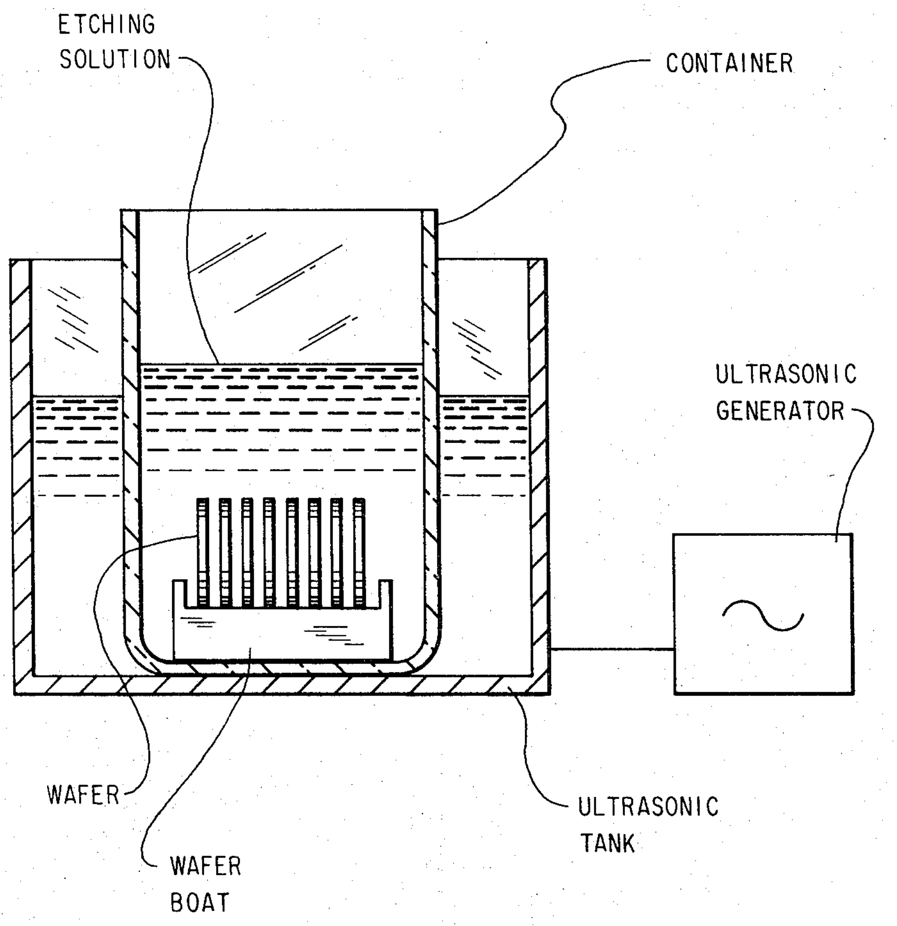
INVENTOR
EUIWON CHOUGH
BY Harry M Weiss
ATTORNEY

PROCESS FOR ETCHING METALS EMPLOYING ULTRASONIC VIBRATION

BACKGROUND OF THE INVENTION

1. Field of the Invention

This invention relates generally to metal etching solutions and metal etching processes and, more particularly, to metal etching solutions and metal etching processes for etching a very fine metal pattern having metal lines in the order of about 0.1 mils in width and spaced from each other by this amount.

2. Description of the Prior Art

In the past, various etching techniques were used for etching very fine metal patterns on an insulating semiconductor substrate surface in order to form a conducting interconnection arrangement for interconnecting various devices in a semiconductor substrate into a desired circuit configuration. Various metal etching solutions were used to etch, for example, aluminum which was generally used as the metal interconnection material. The standard prior art metal etchant was a combination of one or more of the acids; phosphoric, nitric and acetic acid. However, in etching out very fine metal lines which were no wider than approximately 2.5 to 5.0 microns in width (0.1 to 0.2 mils) the standard, commercially available, aluminum etchant did not provide a reliable means for achieving uniform etching of the desired metal line pattern. One disadvantage associated with the prior art etching solution was that the protective photoresist lifted off or became dissolved away when the etching operation took place at high etching temperatures of, for example, about 45°C. This naturally caused the etching away of the entire deposited metal layer.

Other problems associated with the standard prior art metal etching solution was that air bubbles were formed on the metal surface that was to be etched away. These bubbles that were naturally formed during etching prevented uniform etching which, in turn, resulted in the formation of a poorly defined conductive pattern. Hence, metal contact wires were provided at the periphery of each wafer in order to attract the bubbles and prevent these bubbles from interfering with the etching operation at the metal surface regions that were being etched. However, this technique could not always be relied upon to solve the bubbles problem. Apparently, there was some sort of an electrochemical operation which caused air bubbles to be formed on the metal substrate surface. These bubbles, besides causing non-uniform etching, also caused bridging across metal lines which was highly undesirable and created destruction of the integrated circuit product. In some processes in the formation of semiconductor devices, the bubble problem was not as serious because of the use of gold or other metal diffusant materials in the backside of the semiconductor substrate for reducing minority carrier lifetime which also served the function of attracting bubbles. However, even though the diffused gold layer in the backside of the wafer served as a source for attracting and holding the bubbles formed during the standard aluminum etching operation using the conventional etchants identified above, this solution to the bubble problem was not always reliable and consistent. Accordingly, a need existed for providing a solution to the bubble problem, during metal etching, where there are no other metals diffused or contact wires present to serve as an attraction for the bubbles formed during the etching operations. Also, a good solution had to be found to the problem of photoresist lifting up or being dissolved away during etching operations at temperatures of about 45°C or higher which solution would not affect the bubble problem, but would, preferably, eliminate the bubble problem. Of course, etching operations can be carried out at very slow etching rates at lower temperatures without the necessity of going to higher temperatures, however, long etching periods had the same adverse effect on the photoresist as etching at higher temperatures. The problem of providing very fine lines and metal pattern geometries necessary to connect high density integrated circuit devices wherein the lines could not be wider than about 2.5 to 5.0 microns was very serious and a solution to the etching of these lines was needed.

SUMMARY OF THE INVENTION

It is an object of this invention to provide an improved etching solution and etching process for metal etching.

It is another object of this invention to provide an improved etching process and etching solution for etching an aluminum pattern on an insulating semiconductor substrate in order to form an integrated circuit for interconnection between semiconductor devices located in the semiconductor substrate.

It is still another object of this invention to provide a metal etching process and solution for solving the bubble problem and the photoresist destruction or liftoff problem while insuring the formation of very fine metal lines and geometries.

The foregoing, and other objects, features, and advantages of the invention will be apparent from the following, more particular description of the preferred embodiments of the invention, as illustrated in the accompanying drawing.

DESCRIPTION OF THE DRAWING

The sole FIGURE is a side elevational view showing a number of wafers located in a container which holds an etching solution prepared in accordance with this invention wherein the container is subjected to ultrasonic vibrations during the etching operation.

Referring to the sole FIGURE, a container such as made from quartz, glass or plastic is used to contain a metal etching solution preferably consisting of phosphoric acid of about 16–20 parts; nitric acid of about 0.5 – 5 parts; acetic acid of about 0.5 – 5 parts; a mono or polyhydric alcohol, for example, isopropanol, n-propanol, cyclohexanol, benzyl alcohol, glycol, glycerine, 0.5 – 5 parts; water of about 0.5 – 5 parts, and a surfactant such as FC98 or FC170 in minute quantities. If desired, etching can be carried out with the etching solution described above except for acetic acid, however, the addition of acetic acid aids in producing better metal line definition.

At the bottom of the container shown in the sole FIGURE is a wafer boat which contains a plurality of semiconductor wafers on which are deposited the metal coatings that are to be etched by the etching solution. Not shown in the FIGURE is the photoresist layer which defines the portions of the metal layer which are to be etched. The entire container assembly including the wafer boat and etching solution is placed or located in an ultrasonic tank having a frequency transferring medium or fluid which is subjected to ultrasonic vibrations of about 20,000 to 40,000 cycles/second from an ultrasonic generator. An example of an ultrasonic generator is a unit known as Model 520 produced by Branson Instruments, Inc., which makes both the generator and tank. Temperature control of the etching solution can be provided by either an agitation device such as a rotating blade and motor or by a continuous circulating system for continuously moving the etching solution into and out of the container.

The metal etching process is carried out using this ultrasonic means for breaking up the bubbles that are normally formed on the metal surface portions to be etched. Consequently, by using the alcohol as an additive to the acid metal etching mixture, a protective coating is apparently formed on the photoresist layer which does not attack the photoresist during the metal etching operation and this eliminates irregularities in etching known as necking or pitting. The sharp line definition that is achieved with the etching process of this invention avoids the formation of ragged or uneven lines present with other etching operations. This is very critical for etching complicated and fine lines and will become even more important, with time, in the formation of reliable conductive patterns having very small line dimensions and geometries.

Additionally, with this process, the described metal etching solution can operate on metals for periods of about 5 – 40 minutes whereas, without the alcohol additive, the etching solution usually dissolved the entire metal surface in about 5 minutes. This permits greater flexibility in etching times which is important because of the complexity of the lines and line geometries.

One other feature of this solution is that the etching of a metal is the same regardless of the grain size of the metal, the method the metal is deposited, and the photoresist process that is used to define the metal material that is to be etched.

While the invention has been particularly shown and described in reference to the preferred embodiments thereof, it will be understood by those skilled in the art that changes in the form and details may be made therein without departing from the spirit and scope of the invention.

What is claimed is:

1. A process for etching a conductive metal pattern on an insulating layer located on a semiconductor substrate surface comprising the steps of:

inserting the semiconductor substrate having a metal coating on said insulating layer located on said semiconductor substrate into a metal etching solution consisting essentially of 16–20 parts, phosphoric acid, 0.5–5 parts of nitric acid and 0.5–5 parts of an alcohol selected from the class consisting of mono and polyhydric alcohols; and ultrasonically vibrating the metal etching solution at a frequency of about 20,000 to 40,000 cycles/-second during the metal etching operation, portions of said metal coating on said insulating layer located on said semiconductor substrate are protected by a photoresist defining the conductive pattern formed during etching, said metal coating on said insulating layer located on said semiconductor substrate contains aluminum, said metal etching solution also includes 0.5–5 parts water and a surfactant in minute quantities.

2. A process in accordance with claim 1 wherein said alcohol of said metal etching solution is selected from the group consisting of isopropanol, n-propanol, cyclohexanol, benzyl alcohol, glycol, and glycerine.

3. A process in accordance with claim 1 wherein said metal etching solution includes acetic acid of about 0.5 – 5 parts.

* * * * *